United States Patent
Ohashi et al.

(10) Patent No.: US 7,977,696 B2
(45) Date of Patent: Jul. 12, 2011

(54) LIGHT-EMITTING ELEMENT MOUNTING SUBSTRATE, LIGHT-EMITTING ELEMENT PACKAGE, DISPLAY DEVICE, AND ILLUMINATION DEVICE

(75) Inventors: Masakazu Ohashi, Sakura (JP); Ken-ichi Uruga, Kohtoh-ku (JP); Masanori Ito, Kohtoh-ku (JP)

(73) Assignee: Fujikura Ltd., Tokyo (JP)

( * ) Notice: Subject to any disclaimer, the term of this patent is extended or adjusted under 35 U.S.C. 154(b) by 106 days.

(21) Appl. No.: 12/303,022

(22) PCT Filed: May 31, 2006

(86) PCT No.: PCT/JP2006/310899
§ 371 (c)(1),
(2), (4) Date: Dec. 1, 2008

(87) PCT Pub. No.: WO2007/138696
PCT Pub. Date: Dec. 6, 2007

(65) Prior Publication Data
US 2010/0252843 A1    Oct. 7, 2010

(51) Int. Cl.
*H01L 33/00* (2010.01)
(52) U.S. Cl. ............ 257/98; 257/99; 257/E33.061
(58) Field of Classification Search ............ 257/98, 257/99, E33.061
See application file for complete search history.

(56) References Cited

U.S. PATENT DOCUMENTS

| | | | |
|---|---|---|---|
| 5,285,078 A * | 2/1994 | Mimura et al. | 257/3 |
| 6,528,186 B1 | 3/2003 | Bretschneider et al. | |
| 6,900,587 B2 | 5/2005 | Suehiro et al. | |
| 2002/0070449 A1 * | 6/2002 | Yagi et al. | 257/734 |
| 2003/0002272 A1 * | 1/2003 | Suehiro et al. | 362/84 |
| 2004/0124429 A1 | 7/2004 | Stokes et al. | |
| 2004/0135495 A1 * | 7/2004 | Wu et al. | 313/503 |
| 2005/0022697 A1 * | 2/2005 | Benrashid et al. | 106/287.13 |

FOREIGN PATENT DOCUMENTS

| | | |
|---|---|---|
| JP | S60-224538 A | 11/1985 |
| JP | 62-84942 U | 5/1987 |
| JP | S62-224986 A | 10/1987 |
| JP | H06-28635 U | 4/1994 |
| JP | H06-271334 A | 9/1994 |
| JP | H09-212576 A | 8/1997 |
| JP | H11-246834 A | 9/1999 |
| JP | 2000-347601 A | 12/2000 |
| JP | 2003-017751 A | 1/2003 |
| JP | 2003-115614 A | 4/2003 |
| JP | 2003-243724 A | 8/2003 |
| JP | 3511987 B2 | 1/2004 |
| KR | 10-2005-0054813 A | 6/2005 |

OTHER PUBLICATIONS

Shunsuke Fujita, et al., "YAG glass-ceramic phosphor for white LED (I): background and development", PROC. of SPIE, vol. 5941, 2005, pp. 1-7.

* cited by examiner

*Primary Examiner* — Tu-Tu V Ho
(74) *Attorney, Agent, or Firm* — Sughrue Mion, PLLC

(57) ABSTRACT

A light emitting element mounting substrate that enables a high quality light emitting element package to be readily manufactured with minimal variations in the chromaticity when manufacturing a white LED, a light emitting element package that employs the substrate, and a display device and illumination device that employs this package, are provided. In the light emitting element mounting substrate, at least a light emitting element mounting portion of a surface of a core metal is coated with a fluorescent enamel layer that consists of a fluorescent material-containing glass. In the light emitting element package, a light emitting element is mounted on the light emitting element mounting substrate, and the light emitting element is sealed with a transparent sealing resin.

10 Claims, 2 Drawing Sheets

LIGHT-EMITTING ELEMENT MOUNTING SUBSTRATE, LIGHT-EMITTING ELEMENT PACKAGE, DISPLAY DEVICE, AND ILLUMINATION DEVICE

TECHNICAL FIELD

The present invention relates to a light emitting element mounting substrate for mounting a light emitting element such as a light emitting diode (hereinbelow referred to as an LED), a light emitting element package that is formed by packaging a substrate together with a light emitting substrate mounted thereon, and a display device and an illumination device that employs this light emitting element package.

BACKGROUND ART

A light emitting element is generally packaged from the standpoint of protection from outside forces, control of the angle of beam spread of the emitted light, supply of electric power to the light emitting element, and the like (for example, refer to Patent Document 1).

FIG. 4 is a drawing that shows an example of a conventional light emitting element package configuration, with this package configuration being constituted by a package 5 which has a reflective concave portion having a sloping surface for making the light emitted from a mounted light emitting element 1 radiate ahead efficiently, and a pair of electrodes 4 for energizing the light emitting element, the light emitting element 1 such as an LED that is mounted in this package 5, a thin metal wire 2 that electrically connects the light emitting element 1 that is fixed on one of the electrodes 4 and the other electrode 4, and a transparent sealing resin 3 that is filled in the reflective concave portion of the package 5 for sealing the light emitting element 1 from the outside air.

Moreover, in the case of a white LED, a mounting method that is generally employed includes combining a yellow light emitting fluorescent material excited by blue light such as yttrium aluminum garnet fluorescent material with a blue light emitting element that is a nitride system compound semiconductor like InGaN, and in the case of the configuration shown in FIG. 4, it is common to mount the fluorescent material by distributing it in the sealing resin 3.

On the other hand, in order to increase the light emission intensity of light emitting elements such as LEDs, it is effective to increase the heat radiation performance of the package. The light emission efficiency of a light emitting element per unit power consumption is still low with the present technology, and because the electric power that does not contribute to luminescence is converted into heat, the light emitting element itself generates heat. A light emitting element is a kind of semiconductor, and the efficiency of light emission falls as its temperature rises. Therefore, by enhancing the heat radiation performance of a package such as the substrate for mounting the light emitting element, it becomes possible to impress a still larger current to the light emitting element, and, as a result, it is possible to elevate the light emission intensity per light emitting element. Examples of a substrate with a high heat radiation performance include an aluminum nitride substrate and a metal substrate which uses metal for the core.

Patent Document 1: Japanese Unexamined Patent Application, First Publication No. S62-224986

Patent Document 2: Japanese Patent, Publication No. 3511987

In a white LED mounted by a method of combining a yellow light emitting fluorescent material excited by blue light with a blue light emitting element, in the case of a conventional configuration that adds the fluorescent material to a sealing resin as described above, when the addition amount of the fluorescent material to be mounted is not constant, or even if the addition amount is constant with respect to the resin, because the amount of the resin to be mounted that includes the fluorescent material varies, the balance between the blue light emitted from the light emitting element and the yellow light emitted from the fluorescent material is lost, and so as a result, the color chromaticity becomes unstable. Furthermore, the fluorescent material may become settled down in the resin, leading to variations in the emitted color. Due to such variations in the color chromaticity, for those that deviate from the target specifications during mass production, countermeasures need to be taken such as treating them as defective or selling them according to a chromaticity classification, which is a problem leading to an increase in production steps, and moreover, there is the problem of large-scale production of white LEDs within a desired chromaticity range being difficult.

On the other hand, a method of mixing a fluorescent material in a resin has been proposed (for example, refer to Patent Document 2). Patent Document 2 discloses that, in order to suppress chromaticity variation, the fluorescent material is sufficiently mixed in a resin with a device such as a roll mill, and thereby the dispersion state of the fluorescent material in the resin becomes stable, and as a result the variations in chromaticity are greatly reduced. Although reduction of the variation in chromaticity can be said to be achieved by this method, in this conventional method, since long hours is required for mixing and the manufacturing hours is extended, the manufacturing cost increases in terms of manufacture of the product, and it is necessary to purchase a device for kneading the resin in which the fluorescent material has been mixed.

The present invention was made in view of the above circumstances, and has as an object of providing a light emitting element mounting substrate that readily enables manufacture of a high quality light emitting element package with minimal chromaticity variation when manufacturing a white LED, a light emitting element package that is formed by packaging a substrate together with a light emitting substrate mounted thereon, and a display device and illumination device that employs this light emitting element package.

DISCLOSURE OF THE INVENTION

In order to achieve the aforementioned object, the present invention proposes a light emitting element mounting substrate in which at least a light emitting element mounting portion of the surface of a core metal is coated with a fluorescent enamel layer that includes a fluorescent material-containing glass.

It is preferable that the light emitting element mounting substrate of the present invention includes a reflective concave portion that has a sloping surface that reflects light that is emitted from a mounted light emitting element.

In the light emitting element mounting substrate of the present invention, it is preferable that electrodes for energizing a light emitting element that extend to the light emitting element mounting position are provided on the fluorescent enamel layer.

In the light emitting element mounting substrate of the present invention, it is preferable that the fluorescent enamel layer includes a yellow light emitting fluorescent material excited by blue light.

In the light emitting element mounting substrate of the present invention, it is preferable that the fluorescent enamel layer contains 15 mass percent to 65 mass percent of cerium-activated yttrium aluminum garnet.

Also, the present invention proposes a light emitting element package in which a light emitting element is mounted on the light emitting element mounting substrate according to the abovementioned invention, and the light emitting element is sealed with a transparent sealing resin.

In the light emitting element package of the present invention, it is preferable that the light emitting element is a blue light emitting diode; the fluorescent enamel layer includes a yellow light emitting fluorescent material excited by blue light; and it emits white light.

In the light emitting element package according to the present invention, it is preferable that a plurality of light emitting elements are mounted on the light emitting element mounting substrate.

Effects of the Invention

With the light emitting element mounting substrate according to the present invention, since at least a light emitting element mounting portion of the surface of a core metal is coated with a fluorescent enamel layer that includes a fluorescent material-containing glass, by mounting a light emitting element such as an LED in this light emitting element mounting substrate and causing it to emit light, it is possible to easily constitute a light emitting element package in which a portion of the light that is emitted from the light emitting element is directly irradiated to the outside while the remaining light hits the fluorescent enamel substrate and the fluorescence thereof is irradiated to the outside, whereby the mixed light of the light emitted from the light emitting element and said fluorescence is obtained. In particular, by combining a blue LED and yellow light emitting fluorescent material that is excited by blue light, it is suited to the case of manufacturing a white LED package.

In manufacturing this white LED package, conventionally chromaticity variation easily occurs in a manufactured package due to mounting variations since the fluorescent material is mounted by being mixed in the sealing resin. However, in the present invention, since the constitution provides the fluorescent enamel layer containing the fluorescent material on the surface of the substrate, there is minimal variation in the dispersion of the fluorescent material within one batch of a fluorescent material, and so compared to before, chromaticity variation in the white LED package can be significantly reduced.

Also, the core metal that is used for the substrate is easy to machine compared to ceramics or the like, and a substrate structure that allows a plurality of the light emitting elements to be mounted can be easily manufactured.

Moreover, in the structure of a substrate that mounts the light emitting element by providing the reflective concave portion that mounts the light emitting element, since it is not necessary to manufacture by stacking a base material that constitutes a reflective cup on the substrate, the substrate structure is simple, and it is possible to keep down costs associated with assembly, and it is possible to prevent the inclusion of air bubbles that are generated from gaps between the substrate and the base material that constitutes the reflective cup into the sealing resin.

Figure 1:
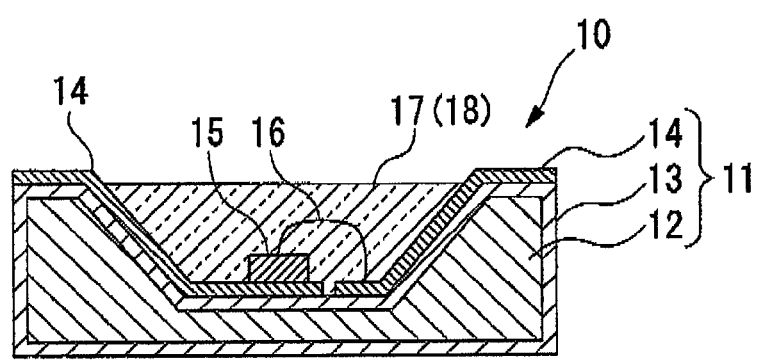
FIG. 1 is a sectional view that shows one embodiment of the light emitting element mounting substrate and light emitting element package according to the present invention.

DESCRIPTION OF REFERENCE NUMERALS 10, 20 light emitting element package; 11, 21 light emitting element mounting substrate; 12, 22 core metal; 13, 23 fluorescent enamel layer; 14, 24 electrode; 15, 25 light emitting element; 16, 26 thin metal wire; 17, 27 reflective concave portion; 18, 28 sealing resin.

BEST MODE FOR CARRYING OUT THE INVENTION

FIG. 1 is a sectional view that shows one embodiment of the light emitting element mounting substrate of the present invention and a light emitting element package that uses it. In FIG. 1, reference numeral 10 denotes a light emitting element package, 11 denotes a light emitting element mounting substrate, 12 denotes a core metal, 13 denotes a fluorescent enamel layer, 14 denotes electrodes, 15 denotes a light emitting element, 16 denotes a thin metal wire, 17 denotes a reflective concave portion, and 18 denotes a transparent sealing resin that is filled in the reflective concave portion 17.

A light emitting element mounting substrate 11 is constituted by a core metal 12 that has a bowl-like concave portion having a sloping wall surface that becomes the reflective concave portion 17, a fluorescent enamel layer 13 that covers the surface of the core metal layer 12, and electrodes 14 for energizing the light emitting element that extend to the light emitting element mounting position that is provided on the fluorescent enamel layer 13. Also, a light emitting element package 10 of the present embodiment has a constitution in which the light emitting element 15 is mounted on the light emitting element mounting substrate 11, and the light emitting element 15 is sealed by the transparent sealing resin 18.

The fluorescent enamel layer 13 that covers the core metal 12, upon receiving and reflecting light emitted from the light emitting element 15, has a function of emitting wavelength-converted fluorescent light by the excited fluorescent material which is contained in said fluorescent enamel layer 13. A fluorescent material-containing glass that constitutes this fluorescent enamel layer 13 is of a configuration that attaches a fluorescent powder to the surface of the core metal 12 by a glassy material (enamel), and the fluorescent powder may exist in a state of at least a portion thereof being dissolved in the glassy material, or being surrounded by the glassy material without dissolving into the glassy material.

As the fluorescent material that is contained in the fluorescent enamel layer 13, in accordance with the emitted chromaticity that is required of the light emitting element package 10, it can be one kind or the mixture of two or more kinds selected from conventional publicly known fluorescent material. In the preferred embodiment of the present invention, in the case of constituting a white LED package, a blue LED is used as the light emitting element 15, and a yellow light emitting fluorescent material that is excited by blue light is used as the fluorescent material. Examples of this yellow light emitting fluorescent material include cerium-activated yttrium aluminum garnet (hereinbelow referred to as YAG:Ce).

In the preferred embodiment of the present invention, in the case of using YAG: Ce as the florescent material, it is proportioned in the range of 15 mass percent to 65 mass percent, preferably 25 mass percent to 60 mass percent, more preferably 35 mass percent to 60 mass percent, and most preferably 45 mass percent to 60 mass percent with respect to the total amount of the raw material (solid raw material) of the fluorescent enamel layer 13. When YAG: Ce is less than 15 mass percent, changing the chromaticity of the blue LED becomes difficult. When YAG: Ce is more than 65 mass percent, the fluorescent enamel layer 13 becomes brittle, and so there is the risk of it cracking after being baked on.

The material that constitutes the core metal 12 is not particularly limited, but a metal material that allows the fluorescent enamel layer 13 to be firmly baked on, is low cast, and is readily workable is preferred, with example materials including low-carbon steel and stainless steel. Also, in order to improve the adhesion of the fluorescent material-containing glass that constitutes the fluorescent enamel layer 13, the metal surface may be subjected to an oxidation treatment. The shape of the core metal 12 is also not particularly limited, and may for example be a metal plate of various shapes such as a disc plate shape or square plate shape or a shape having unevenness. The method of forming the concave portion that becomes the reflective concave portion 17 in the core metal 12 is not particularly limited, and may be formed using a machining method that employs drilling or a polishing process with a polishing agent.

In describing an example of a method of manufacturing an enamel substrate in which the surface of the core metal 12 is covered with the fluorescent enamel layer 13, first, a bowl-like concave portion having a sloping wail surface that becomes the reflective concave portion 17 is produced by a machining process with a drill or a pressing process in the core metal 12 such as a low carbon steel plate. Meanwhile, a dispersion liquid for forming the fluorescent enamel layer is produced by mixing glass powder with a florescent material powder in a suitable dispersion medium. Next, that dispersion liquid is coated on the surface of the core metal 12 and baked at a high temperature to produce the fluorescent enamel layer 13 that consists of a glass containing a fluorescent material. The fluorescent enamel layer 13 is also laminated on the concave portion that is formed in the core metal 12, and the reflective concave portion 17 is formed having a sloping surface that is smooth and contains the fluorescent material.

In the case of forming the reflective concave portion 17 having a sloping surface by mechanical machining such as a drill process, it can be said that it is difficult to keep the smoothness of the surface as described above, however, a metal such as low carbon steel is easy to process, and even if the smoothness of the surface cannot be ensured, by laminating the fluorescent enamel layer 13, the rough surface portions are buried and so the smoothness of the surface of the fluorescent enamel layer 13 that is obtained after baking is generally high. Accordingly, the smoothness of the sloping surface of the reflective concave portion 17 becomes high, and the reflective concave portion 17 with a high optical reflectance is readily attained.

The light emitting element 15 that is used in the present invention is not particularly limited, but a semiconductor light emitting element such as an LED or laser diode (LD), organic EL element or the like is suitably used. In the preferred embodiment of the present invention that constitutes a white LED package as described above, a blue LED that includes a nitride-based compound semiconductor is used.

The electrodes 14 and the thin metal wire 16 that supply power to the light emitting element 15 can be formed for example by the methods of (1) to (3) given below.

(1) An electrical circuit is manufactured with a thick film silver paste layer in the reflective concave portion 17, and the light emitting element 15 is mounted on one electrode 14, and the thin metal wire 16 such as a gold wire is bonded on the other electrode 14, which is opposed by the one electrode 14 via a gap.

(2) An electrode 14 such as metal foil is prepared, and this is adhered to the fluorescent enamel layer 13, and the light emitting element 15 is mounted similarly to (1) above and electrically connected.

(3) An electrode that is prepared outside of the reflective concave portion 17 and the light emitting element 15 that is mounted on the fluorescent enamel layer 13 in the reflective concave portion 17 are bonded by the thin metal wire 16 such as a gold wire and electrically connected.

In the light emitting element package 10 of the present embodiment, because the fluorescent enamel layer 13 is formed on the surface of the reflective concave portion 17, it is preferable that the electrodes 14 be dimensionally narrow. In the case of forming the electrodes 14 with silver, although the light that is emitted from the light emitting element 15 such as a blue LED is strongly reflected by the electrodes 14, since the electrodes 14 do not include a fluorescent material, the portions where the electrodes 14 are appear to emit only blue light, and so in the case of widening the width of the electrodes 14, a white color that is finely mixed is not obtained. Accordingly, it is preferable that the width of the electrode 14 be 0.8 mm or less and more preferably 0.5 mm or less.

After mounting the light emitting element 15 in the reflective concave portion 17, the transparent sealing resin 18 is filled in the reflective concave portion 17, and the light emitting element 15 is sealed from the outside air. As this sealing resin 18, a thermally hardening-type epoxy resin or the like is used.

In the light emitting element mounting substrate 11 of the present embodiment, since at least the light emitting element mounting portion of the surface of the core metal 12 is coated with the fluorescent enamel layer 13 that includes a fluorescent material-containing glass, by mounting the light emitting element 15 in this light emitting element mounting substrate 11 and causing it to emit light, it is possible to easily constitute the light emitting element package 10 in which a portion of the light that is emitted from the light emitting element 15 is directly irradiated to the outside while the remaining light hits the fluorescent enamel substrate 13 and the fluorescence thereof is irradiated to the outside, whereby light is obtained that contains the light that was emitted from the light emitting element 15 and the fluorescence being mixed together. In particular, by combining a blue LED and yellow light emitting fluorescent material that is excited by blue light, it is suited to the case of manufacturing a white LED package.

In manufacturing this white LED package, conventionally chromaticity variation easily occurs in a manufactured package due to mounting variations since the fluorescent material is mounted by being mixed in the sealing resin. However, in the present embodiment since the constitution provides the fluorescent enamel layer 13 that contains the fluorescent material on the surface of the substrate, there is minimal variation in the dispersion of the fluorescent material within one batch of a fluorescent material, and so compared to before, chromaticity variation in the white LED package can be significantly reduced.

Also, the core metal 12 that is used for the substrate is easy to machine compared to ceramics or the like, and a substrate structure that allows a plurality of the light emitting elements 15 to be mounted can be easily manufactured.

Moreover, in the structure of a substrate that mounts the light emitting element 15 by providing the reflective concave portion 17 that mounts the light emitting element 15, since it is not necessary to manufacture by stacking a base material that constitutes a reflective cup on the substrate, the substrate structure is simple, and it is possible to keep down costs associated with assembly, and it is possible to prevent the inclusion of air bubbles into the sealing resin.

Note that in the aforementioned structure, control of the angle of beam spread etc. may be performed by molding an optical lens body in the light emitting surface side with resin or the like. Also, in the case of the structure of (3), when a resin is disposed so as to mold the thin metal wire 16, it can be said to be a desirable structure from the standpoint of reliability.

Figure 2:
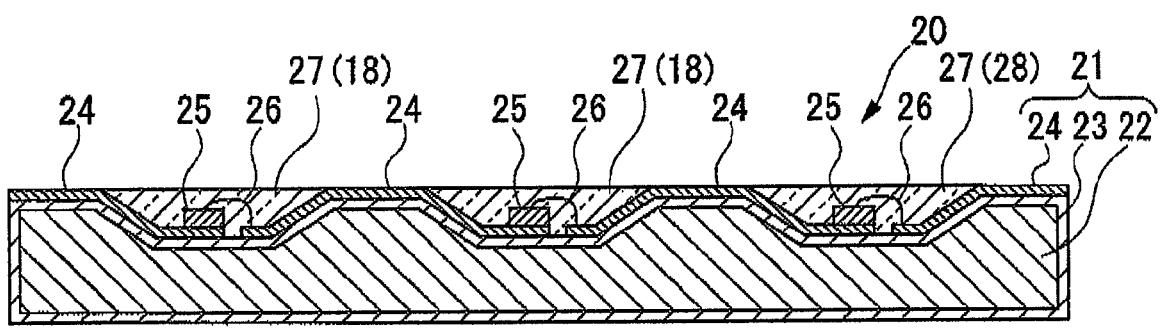
FIG. 2 is a sectional view that shows another embodiment of the light emitting element mounting substrate and light emitting element package according to the present invention.
Figure 3:
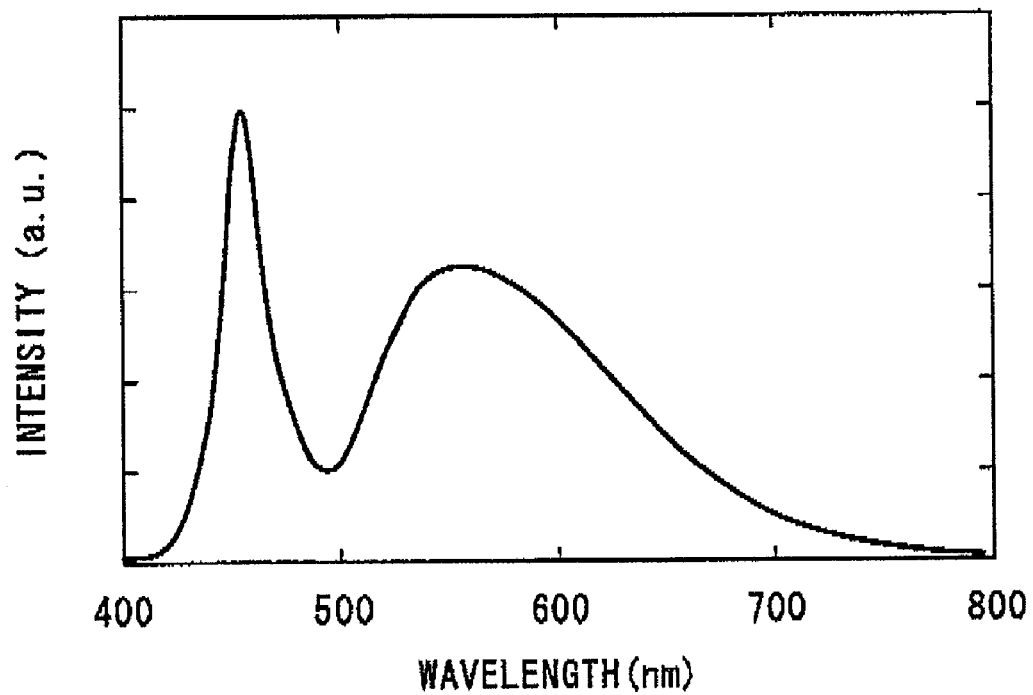
FIG. 3 is a graph that shows a wavelength spectrum of the white LED package object manufactured in Example 5.
Figure 4:
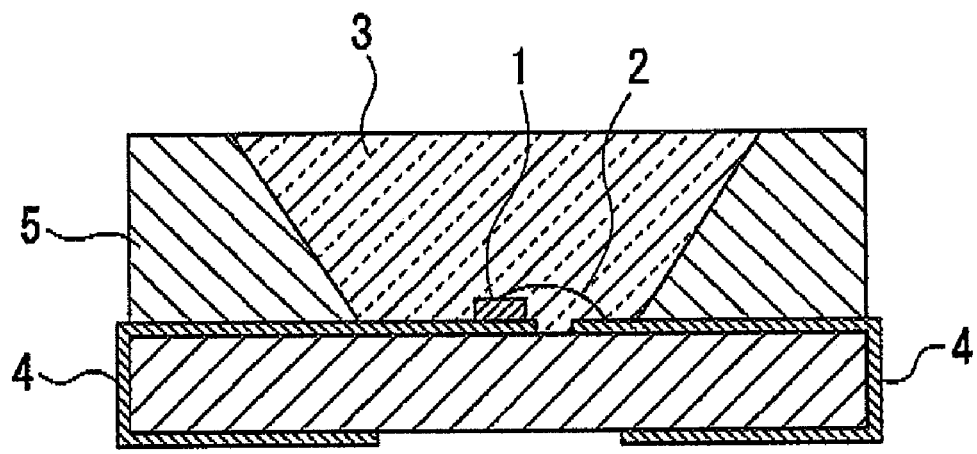
FIG. 4 is a sectional view that shows an example of a conventional light emitting element package configuration.

FIG. 2 is a sectional view that shows another embodiment of the light emitting element mounting substrate and light emitting element package according to the present invention. In FIG. 2, reference numeral 20 denotes a light emitting element package, 21 denotes a light emitting element mounting substrate, 22 denotes a core metal, 23 denotes a fluorescent enamel layer, 24 denotes electrodes, 25 denotes a light emitting element, 26 denotes a thin metal wire, 27 denotes a reflective concave portion, and 28 denotes a transparent sealing resin.

In the present embodiment, illustrated are a light emitting element mounting substrate 21 that allows a plurality of the light emitting elements 25 to be mounted on a single substrate, and the light emitting element package 20 that is formed by mounting a plurality of the light emitting elements 25 in the light emitting element mounting substrate 21 and sealing them with the sealing resin 28. In the present embodiment, for the core metal 22, the fluorescent enamel layer 23, the electrodes 24, the light emitting element 25, the thin metal wire 26, the reflective concave portion 27, and the sealing resin 28, it is possible to use those that are the same as the core metal 12, the fluorescent enamel layer 13, the electrode 14, the light emitting element 15, the fine metal wire 16, the reflective concave portion 17, and the sealing resin 18 shown in FIG. 1, although the shapes and light emitting element mounted number differ.

EXAMPLES

A low carbon steel plate with a height of 5 mm, width of 5 mm and thickness of 1 mm was used as the core metal. A concave portion was formed by a drill so that a bowl-shaped reflective concave portion is formed. Regarding the dimensions of the concave portion bottom surface, a diameter of 1 mm, depth of 0.5 mm, and slope angle of 45° are formed at the bottom surface of the reflective concave portion.

As the raw materials of the fluorescent enamel layer, a glass powder and a cerium-activated yttrium aluminum garnet fluorescent material are used. These two powders are sufficiently mixed together, and distributed in a dispersing medium which contains 2-propanol and water. This was applied to the surface of the core metal. Then, it was baked at 850° C. in atmospheric air to form the fluorescent enamel layer which consists of a glass containing a fluorescent material. A sample was prepared with the thickness of the fluorescent enamel layer being targeted at 100 µm. The electrodes were prepared by coating silver paste in a predetermined electrode pattern and baking. It was produced so as to have the dimensions of a thickness of 0.1 mm and a width of 0.5 mm.

Next, the mounting of the LED is shown. The light emitting element mounting substrates of Examples 1 to 6 and Comparative Example 1 shown in Table 1 were prepared by varying the amount of the fluorescent material in the fluorescent enamel layer raw material, and a white LED package was manufactured by mounting a blue LED as a light emitting element in the respective light emitting element mounting substrates.

Initially, a blue LED that includes a nitride system compound semiconductor was mounted on one electrode. The blue LED was selected whose light-emitting wavelength is 450 nm at the peak wavelength. Moreover, using a wire bonding device, the blue LED and the other electrode were bonded. Also, the sample was produced by filling a transparent epoxy resin in the reflective concave portion in which the light emitting element was mounted and subjecting it to thermal curing, and then evaluated.

Table 1 shows the results of measuring the chromaticity, substrate appearance and thermal conductivity of each white LED package of Examples 1 to 6 and Comparative Example 1. The measurement shows the average value of 10 samples (Table 1). Also, Table 2 shows the experimental values for the chromaticity variations of each white LED package of Examples 1 to 6.

The values that express the glass powder addition amount and fluorescent material addition amount in Table 1 are in mass percent. Also, the chromaticity, substrate appearance and thermal conductivity were measured in the following manner.

<Chromaticity>

The chromaticity of the manufactured white LED packages was measured using a chromaticity measurement equipment (Multimedia Display Tester 3298F manufactured by Yokogawa Electric Corp.).

<Substrate Appearance>

The respective light emitting element mounting substrates of Examples 1 to 6 and Comparative Example 1 were visually checked and examined for flaws such as cracks. Samples with no flaws in their appearance were evaluated as good, while those in which cracks could be visually confirmed were evaluated as partially cracked.

<Thermal Conductivity>

Glass sheets were fabricated with the respective glass compositions of the light emitting element mounting substrates of Examples 1 to 6 and Comparative Example 1 and measured by the laser flash method (unit: W/mK). The measurement used a laser flash thermal constant analyzer (TC-7000 made by ULVAC Technologies), and the enamel glass material was manufactured with a size of ø 10×1 mm thickness and measured in a vacuum. The measurement method was carried out in conformance with JIS R1611-1991.

TABLE 1

| | Glass Powder Addition Amount | Fluorescent Material Addition Amount | Chromaticity (x, y) | Substrate Appearance | Thermal Conductivity (W/mK) |
|---|---|---|---|---|---|
| Example 1 | 85 | 15 | (0.20, 0.14) | Good | 0.40 |
| Example 2 | 75 | 25 | (0.24, 0.21) | Good | 0.40 |
| Example 3 | 65 | 35 | (0.26, 0.27) | Good | 0.39 |
| Example 4 | 55 | 45 | (0.32, 0.32) | Good | 0.42 |
| Example 5 | 45 | 55 | (0.34, 0.36) | Good | 0.37 |
| Example 6 | 40 | 60 | (0.35, 0.37) | Good | 0.39 |
| Comparative Example 1 | 30 | 70 | Not measured | Partially cracked | 0.38 |

TABLE 2

| | Glass Powder Addition Amount | Fluorescent Material Addition Amount | Chromaticity (x, y) |
|---|---|---|---|
| Example 1 | 85 | 15 | (0.20, 0.14), (0.20, 0,14), (0.21, 0.15), (0.21, 0.14), (0.20, 0.14), (0.20, 0.14), (0.19, 0.14), (0.20, 0.14), (0.21, 0.13), (0.20, 0.14) |
| Example 2 | 75 | 25 | (0.24, 0.21), (0.23, 0.21), (0.24, 0.21), (0.24, 0.21), (0.24, 0.20), (0.24, 0.21), (0.24, 0.21), (0.24, 0.21), (0.24, 0.20), (0.24, 0.21) |
| Example 3 | 65 | 35 | (0.26, 0.28), (0.26, 0.27), (0.26, 0.27), (0.26, 0.27), (0.26, 0.27), (0.26, 0.27), (0.26, 0.26), (0.26, 0.27), (0.25, 0.26), (0.26, 0.27) |
| Example 4 | 55 | 45 | (0.32, 0.32), (0.32, 0.32), (0.32, 0.32), (0.32, 0.32), (0.31, 0.31), (0.32, 0.32), (0.31, 0.31), (0.32, 0.32), (0.32, 0.32), (0.32, 0.32) |
| Example 5 | 45 | 55 | (0.35, 0.36), (0.34, 0.36), (0.34, 0.36), (0.34, 0.36), (0.34, 0.36), (0.34, 0.36), (0.34, 0.37), (0.34, 0.36), (0.34, 0.35), (0.34, 0.36) |
| Example 6 | 40 | 60 | (0.35, 0.37), (0.35, 0.37), (0.35, 0.37), (0.35, 0.37), (0.35, 0.37), (0.35, 0.37), (0.35, 0.37), (0.35, 0.38), (0.35, 0.37), (0.35, 0.37) |

From the above test results, it is evident that when the fluorescent enamel layer is formed by adding a fluorescent material powder of 15 mass percent or more, the chromaticity of the LED changes. Also, it was found that Examples 4 to 6 show an luminescent color of daylight color as specified by the CIE (Commission Internationale de l'Eclairage). Also, it was confirmed that the addition of a fluorescent material hardly affects the heat radiation performance of a substrate.

INDUSTRIAL APPLICABILITY

According to the present invention, it is possible to provide a light emitting element mounting substrate that enables a high quality light emitting element package to be readily manufactured with minimal variations in the chromaticity when manufacturing a white LED, a light emitting element package in which a light emitting element is packaged by being mounted on the substrate, and a display device and illumination device that employs this light emitting element package.

The invention claimed is:

1. A light emitting element mounting substrate in which at least a light emitting element mounting portion of a surface of a core metal is coated with a fluorescent enamel layer that consists of a fluorescent material-containing glass, the fluorescent enamel layer covers only the core metal, and an electrode is provided between the fluorescent enamel layer and a light emitting element.

2. The light emitting element mounting substrate according to claim 1, comprising a reflective concave portion that has a sloping surface that reflects light that is emitted from a mounted light emitting element.

3. The light emitting element mounting substrate according to claim 1, wherein electrodes for energizing a light emitting element that extend to the light emitting element mounting position are provided on the fluorescent enamel layer.

4. The light emitting element mounting substrate according to claim 1, wherein the fluorescent enamel layer includes a yellow light emitting fluorescent material excited by blue light.

5. The light emitting element mounting substrate according to claim 1, wherein the fluorescent enamel layer contains 15 mass percent to 65 mass percent of cerium-activated yttrium aluminum garnet.

6. A light emitting element package wherein a light emitting element is mounted on the light emitting element mounting substrate according to claim 1, and the light emitting element is sealed with a transparent sealing resin.

7. The light emitting element package according to claim 6, wherein:

the light emitting element is a blue light emitting diode;
the fluorescent material-containing glass includes a yellow light emitting fluorescent material excited by blue light; and
it emits white light.

8. The light emitting element package according to claim 6, wherein a plurality of light emitting elements are mounted on the light emitting element mounting substrate.

9. A display device comprising the light emitting element package according to claim 6.

10. An illumination device comprising the light emitting element package according to claim 6.

* * * * *